US011342920B1

(12) United States Patent
Bhattacharya et al.

(10) Patent No.: US 11,342,920 B1
(45) Date of Patent: May 24, 2022

(54) PULSE SELECTOR SYSTEM

(71) Applicants: Dipankar Bhattacharya, Macungie, PA (US); Donald L. Miller, Export, PA (US); Randall M. Burnett, Catonsville, MD (US)

(72) Inventors: Dipankar Bhattacharya, Macungie, PA (US); Donald L. Miller, Export, PA (US); Randall M. Burnett, Catonsville, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 17/142,829

(22) Filed: Jan. 6, 2021

(51) Int. Cl.
| H03K 19/21 | (2006.01) |
| H03K 19/195 | (2006.01) |
| H01L 39/22 | (2006.01) |
| G06N 10/00 | (2022.01) |
| H03K 3/38 | (2006.01) |

(52) U.S. Cl.
CPC ........... *H03K 19/195* (2013.01); *G06N 10/00* (2019.01); *H01L 39/223* (2013.01); *H03K 3/38* (2013.01)

(58) Field of Classification Search
CPC ........ G06N 10/00; H01L 39/223; H03K 3/38; H03K 19/195
See application file for complete search history.

(56) References Cited

U.S. PATENT DOCUMENTS

| 10,320,394 | B1 * | 6/2019 | Powell | H03K 19/0008 |
| 10,331,163 | B1 * | 6/2019 | Luo | G01R 33/0358 |
| 10,447,278 | B1 * | 10/2019 | Reohr | G06N 10/00 |
| 10,447,279 | B1 * | 10/2019 | Braun | H03K 19/23 |
| 10,554,207 | B1 * | 2/2020 | Herr | H03K 3/38 |

(Continued)

FOREIGN PATENT DOCUMENTS

| EP | 3217336 A1 | 9/2017 |
| JP | 2000268579 A | 9/2000 |

(Continued)

OTHER PUBLICATIONS

Canadian Office Action for Application No. 3070090 dated Mar. 15, 2021.

(Continued)

*Primary Examiner* — Kurtis R Bahr
(74) *Attorney, Agent, or Firm* — Tarolli, Sundheim, Covell & Tummino LLP

(57) ABSTRACT

One example includes a pulse selector system. The pulse selector system includes an input Josephson transmission line (JTL) configured to propagate an input reciprocal quantum logic (RQL) pulse received at an input based on a bias signal. The RQL pulse includes a fluxon and an antifluxon. The system also includes an escape Josephson junction coupled to an output of the input JTL. The escape Josephson junction can be configured to pass a selected one of the fluxon and the antifluxon of the RQL pulse and to trigger in response to the other of the fluxon and the antifluxon of the RQL pulse to block the other of the fluxon and the antifluxon of the RQL pulse. The system further includes an output JTL configured to propagate the selected one of the fluxon and the antifluxon as a unipolar pulse to an output based on the bias signal.

20 Claims, 4 Drawing Sheets

(56) References Cited

U.S. PATENT DOCUMENTS

| | | | |
|---|---|---|---|
| 10,892,761 B1* | 1/2021 | Braun | H03K 3/38 |
| 2013/0043945 A1 | 2/2013 | McDermott et al. | |
| 2017/0085231 A1 | 3/2017 | Abdo | |
| 2018/0226974 A1* | 8/2018 | Harms | H03K 19/195 |
| 2018/0261932 A1 | 9/2018 | Tuckerman | |
| 2020/0044632 A1* | 2/2020 | Powell, III | H03K 3/38 |

FOREIGN PATENT DOCUMENTS

| | | | |
|---|---|---|---|
| JP | 2005188947 A | 7/2005 | |
| JP | 2005527902 A | 9/2005 | |
| JP | 2009225213 A | 10/2009 | |
| JP | 2011530870 A | 12/2011 | |
| JP | 5835377 B2 | 12/2015 | |
| JP | 6192036 B2 | 9/2017 | |
| WO | 2015050622 A1 | 4/2015 | |

OTHER PUBLICATIONS

Japanese Office Action for Application No. 2020-503925 dated Mar. 2, 2021.
Japanese Office Action for Application No. 2020-517875 dated Feb. 24, 2021.
Canadian Office Action for Application No. 3076182 dated Apr. 13, 2021.
Japanese Office Action for Application No. 2020-517875 dated May 18, 2021.

* cited by examiner

PULSE SELECTOR SYSTEM

TECHNICAL FIELD

This disclosure relates generally to classical and superconducting computing systems, and more specifically to a pulse selector system.

BACKGROUND

In superconducting computer systems, data is provided as pulsed signals that can be propagated along transmission lines. For example, a Josephson transmission line (JTL) can propagate pulsed data by sequential triggering of Josephson junctions. Superconducting data can include different types of pulsed data. Reciprocal Quantum Logic (RQL) encodes data using pairs of positive and negative flux quanta, also referred to as a fluxon and an antifluxon, as the logic data. Single Flux Quantum (SFQ) logic uses a single (positive) flux quantum as its logic datum. An extensive library of logic gates has been developed for each logic family.

SUMMARY

One example includes a pulse selector system. The pulse selector system includes an input Josephson transmission line (JTL) configured to propagate an input reciprocal quantum logic (RQL) pulse received at an input based on a bias signal. The RQL pulse includes a fluxon and an antifluxon. The system also includes an escape Josephson junction coupled to an output of the input JTL. The escape Josephson junction can be configured to pass a selected one of the fluxon and the antifluxon of the RQL pulse and to trigger in response to the other of the fluxon and the antifluxon of the RQL pulse to block the other of the fluxon and the antifluxon of the RQL pulse. The system further includes an output JTL configured to propagate the selected one of the fluxon and the antifluxon as a unipolar pulse to an output based on the bias signal.

Another example includes a method for selecting a pulse from an RQL pulse. The method includes receiving the RQL pulse at an input of an input JTL. The RQL pulse includes a fluxon and an antifluxon. The method also includes providing an AC clock signal to the input JTL to propagate the RQL pulse to an escape Josephson junction. The escape Josephson junction can be configured to pass one of the fluxon and the antifluxon of the RQL pulse and to trigger in response to the other of the fluxon and the antifluxon of the RQL pulse to block the other of the fluxon and the antifluxon of the RQL pulse. The method further includes providing the AC clock signal to an output JTL to propagate the selected one of the fluxon and the antifluxon as a unipolar pulse to an output.

Another example includes a pulse selector system. The pulse selector system includes an input Josephson transmission line (JTL) configured to propagate an input reciprocal quantum logic (RQL) pulse received at an input based on a bias signal. The RQL pulse includes a fluxon and an antifluxon. The system also includes an escape Josephson junction coupled to an output of the input JTL and a current control inductor coupled to the escape Josephson junction and an output of the input JTL. The current control inductor can be configured to conduct bias current from the escape Josephson junction to select the fluxon and to trigger the escape Josephson junction to block the antifluxon, or to conduct the bias current to the escape Josephson junction to trigger the escape Josephson junction to block the fluxon and to select the antifluxon. The system further includes an output JTL configured to propagate the selected one of the fluxon and the antifluxon as a unipolar pulse to an output based on the bias signal.

DETAILED DESCRIPTION

Figure 1:
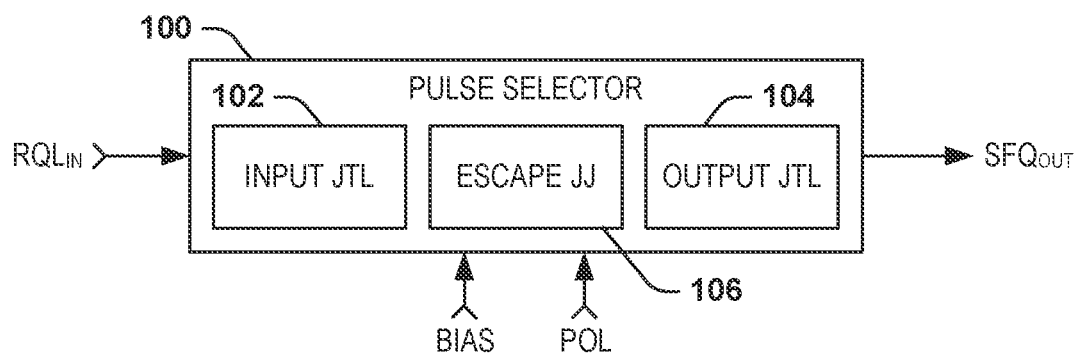
FIG. 1 illustrates an example of a pulse selector system.

This disclosure relates generally to classical and superconducting computing systems, and more specifically to a pulse selector system. The pulse selector system can be implemented to convert a reciprocal quantum logic (RQL) pulse into a single unipolar pulse (e.g., a single flux quantum (SFQ)) pulse. As an example, the unipolar pulse can be positive or negative, such that the unipolar pulse can be a fluxon or an antifluxon. As an example, as described in greater detail herein, the pulse selector system can be programmed to switch between selecting a fluxon and an antifluxon for a given RQL pulse.

The pulse selector system includes an input JTL that is controlled by a bias signal (e.g., a clock signal, such as an in-phase component of an RQL clock signal) to propagate the RQL pulse from an input of the input JTL. The RQL pulse is thus provided to an escape Josephson junction that is coupled between the input JTL and an output JTL that is likewise controlled by the bias signal (e.g., the clock signal, such as a quadrature-phase component of an RQL clock signal). A current direction inductor can be arranged between the input and output JTLs and can be configured to conduct a bias current from or to the escape Josephson junction. The escape Josephson junction can thus pass a selected one of the fluxon and the antifluxon of the RQL pulse based on the direction of the bias current through the escape Josephson junction, and can trigger to block the other of the fluxon and the antifluxon. As described herein, the term "block" with reference to the triggering of the escape Josephson junction refers to the cancellation of the non-selected one of the fluxon and the antifluxon in the direction of the output JTL from the escape Josephson junction based on the triggering of the escape Josephson junction. Therefore, the selected one of the fluxon and the antifluxon can propagate as a unipolar pulse through the output JTL to an output.

For example, the current direction inductor can conduct current from the escape Josephson junction, such as a circulating current from the output JTL. For example, the fluxon of the RQL pulse can trigger an output Josephson junction of the output JTL to provide the bias current from the output JTL through the escape Josephson junction and through the current direction inductor. Therefore, the bias current can provide a negative bias to the escape Josephson junction to trigger the escape Josephson junction in response to the antifluxon, thus blocking the antifluxon. As another example, the current direction inductor can provide the bias current to the escape Josephson junction, such as from a superconducting phase source that is coupled the current direction inductor (e.g., a Josephson junction in a $2\pi$ state).

Therefore, the escape Josephson junction can be positively biased to trigger the escape Josephson junction in response the fluxon, thus subsequently allowing the antifluxon to pass through the output JTL. Accordingly, the pulse selector system can select the unipolar pulse polarity based on the polarity of the bias current through the current direction inductor.

FIG. 1 illustrates an example of a pulse selector system 100. The pulse selector system 100 can be implemented to convert a reciprocal quantum logic (RQL) pulse into a single unipolar pulse (e.g., a single flux quantum (SFQ)) pulse. The pulse selector system 100 can be implemented in any of a variety of superconducting computer environments that can implement RQL pulses and SFQ pulses. As an example, the pulse selector system 100 can be configured to provide unipolar pulses to a flux pump or to any of a variety of SFQ logic gates. As described in greater detail herein, the unipolar pulses can be positive or negative, such that the unipolar pulse can be a fluxon or an antifluxon.

The pulse selector system 100 includes an input JTL 102 and an output JTL that are controlled by a bias signal BIAS. For example, the bias signal BIAS can be arranged as an AC clock signal, such as a quadrature RQL clock signal. As an example, the input JTL 102 can be controlled by an in-phase component of the RQL clock signal and the output JTL 104 can be controlled by a quadrature-phase component of the RQL clock signal. The input JTL 102 can thus receive an RQL pulse, demonstrated in the example of FIG. 1 as a signal $RQL_{IN}$, at an input and can propagate the RQL pulse $RQL_{IN}$. The pulse selector system 100 also includes an escape Josephson junction 106 that is coupled between the input JTL 102 and the output JTL 104. For example, the escape Josephson junction 106 can be designed to have a critical current that is greater than the critical current of the Josephson junctions of the input and output JTLs 102 and 104. As described in greater detail herein, the escape Josephson junction 106 can select one of the fluxon and the antifluxon of the RQL pulse $RQL_{IN}$ and can block the other of the fluxon and the antifluxon of the RQL pulse $RQL_{IN}$. Therefore, the output JTL 104 can propagate the selected one of the fluxon and the antifluxon as a unipolar pulse, demonstrated in the example of FIG. 1 as a signal $SFQ_{OUT}$, from an output of the pulse selector system 100.

As an example, the escape Josephson junction 106 can select the fluxon or the antifluxon based on a current direction of a bias current through the escape Josephson junction 106. For example, in response to a first direction of the bias current (opposite the propagation of the RQL pulse $RQL_{IN}$), the escape Josephson junction 106 can pass the fluxon of the RQL pulse $RQL_{IN}$ and can trigger in response to the antifluxon of the RQL pulse $RQL_{IN}$, thus blocking the antifluxon. Alternatively, in response to a second direction of the bias current opposite the first direction (therefore in the same direction as the propagation of the RQL pulse $RQL_{IN}$), the escape Josephson junction 106 can trigger in response to the fluxon to block the fluxon, and can pass the antifluxon to the output JTL 104. For example, the escape Josephson junction 106 can include a current direction inductor that can conduct the bias current. As described in greater detail herein, the current direction inductor can be coupled to a superconducting phase source that can be activated and deactivated via a current direction signal, demonstrated in the example of FIG. 1 as a signal DIR. Therefore, the selection between the passing of the fluxon and the antifluxon as the unipolar pulse $SFQ_{OUT}$ can be provided based on the current direction signal POL to provide selectivity of the polarity of the unipolar pulse $SFQ_{OUT}$.

Figure 2:
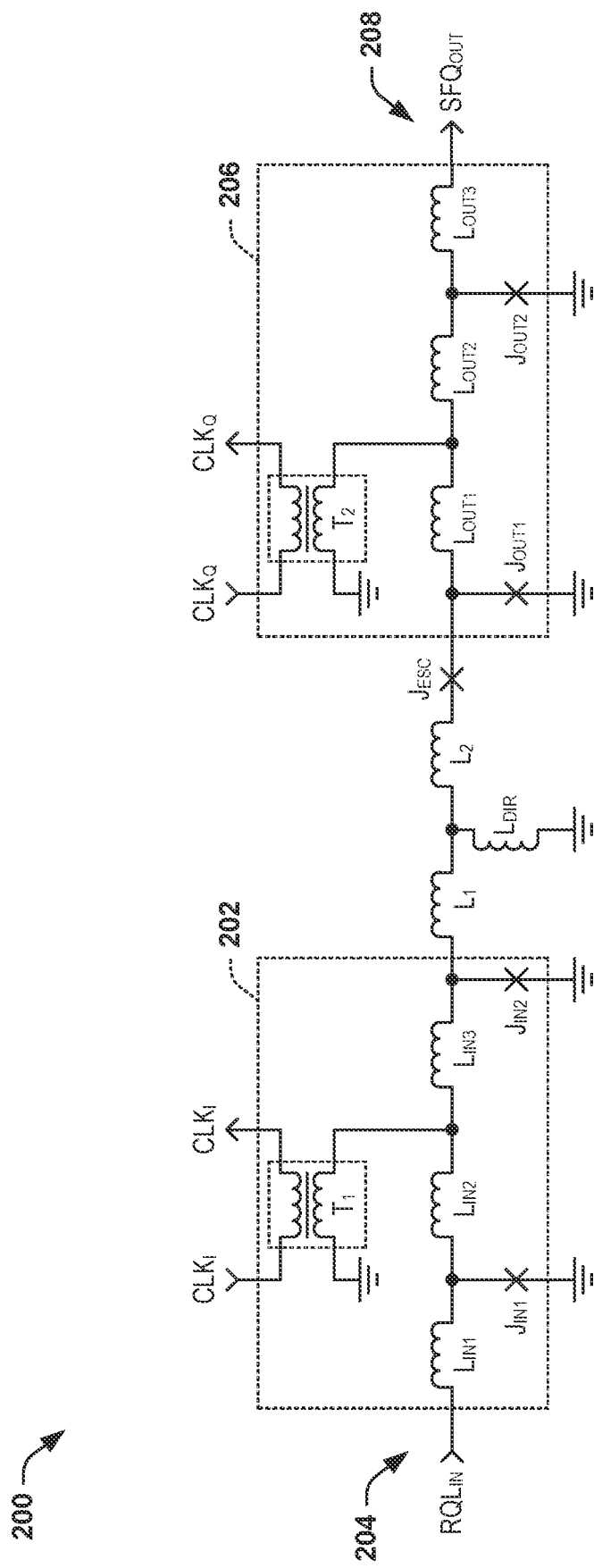
FIG. 2 illustrates an example of a pulse selector circuit.

FIG. 2 illustrates an example of a pulse selector circuit 200. The pulse selector circuit 200 can be configured substantially the same as the pulse selector system 100 in the example of FIG. 1. Therefore, reference is to be made to the example of FIG. 1 in the following description of the example of FIG. 2.

The pulse selector circuit 200 includes an input JTL 202. The input JTL 202 includes a first input inductor $L_{IN1}$, a first input Josephson junction $J_{IN1}$, a second input Josephson junction $J_{IN2}$, a second input inductor $L_{IN2}$, and a third input inductor $L_{IN3}$. The second and third input inductors $L_{IN2}$ and $L_{IN3}$ interconnect the first and second Josephson junctions $J_{IN1}$ and $J_{IN2}$. A transformer $T_1$ inductively couples an in-phase component of an RQL clock signal, demonstrated in the example of FIG. 2 as a signal $CLK_I$, to provide a bias current $I_I$ between the second and third input inductors $L_{IN2}$ and $L_{IN3}$. Therefore, during a positive amplitude of the in-phase component of the clock signal $CLK_I$, the input JTL 202 propagates an RQL pulse $RQL_{IN}$ that is received at an input 204.

The pulse selector circuit 200 also includes an output JTL 206. The output JTL 206 includes a first output Josephson junction $J_{OUT1}$, a second output Josephson junction $J_{OUT2}$, a first output inductor $L_{OUT1}$, a second output inductor $L_{OUT2}$, and a third output inductor $L_{OUT3}$. The first and second output inductors $L_{OUT1}$ and $L_{OUT2}$ interconnect the first and second Josephson junctions $J_{OUT1}$ and $J_{OUT2}$. A transformer $T_2$ inductively couples a quadrature-phase component of an RQL clock signal, demonstrated in the example of FIG. 2 as a signal $CLK_Q$, to provide a bias current $I_Q$ between the first and second output inductors $L_{OUT1}$ and $L_{OUT2}$. Therefore, during a positive amplitude of the quadrature-phase component of the clock signal $CLK_I$, and thus approximately 90° out of phase of the in-phase component of the clock signal $CLK_I$, the output JTL 206 propagates a unipolar pulse $SFQ_{OUT}$ that is provided from an output 208.

The pulse selector circuit 200 includes a first inductor $L_1$ and a second inductor $L_2$ that are arranged between the input and output JTLs 202 and 206. The pulse selector circuit 200 further includes a current direction inductor $L_{DIR}$ that is arranged between the first and second inductors $L_1$ and $L_2$ and is coupled to a low-voltage rail (e.g., ground). Additionally, an escape Josephson junction $J_{ESC}$ is arranged in series with the second inductor $L_2$ between the current direction inductor $L_{DIR}$ and the output JTL 206. As an example, the escape Josephson junction $J_{ESC}$ can have a critical current that is greater than the critical current of the input Josephson junctions $J_{IN1}$ and $J_{IN2}$ and the output Josephson junctions $J_{OUT1}$ and $J_{OUT2}$. In the example of FIG. 2, the escape Josephson junction $J_{ESC}$ selects the fluxon to pass through the escape Josephson junction $J_{ESC}$ and rejects the antifluxon. Therefore, the output JTL 206 can propagate the fluxon to the output 208 as the unipolar pulse $SFQ_{OUT}$.

Figure 3:
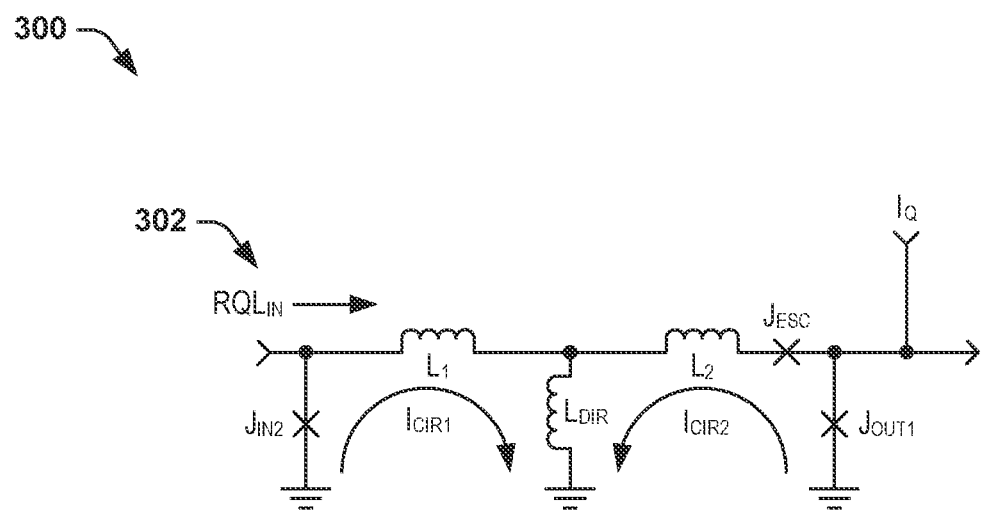
FIG. 3 illustrates an example diagram of a pulse selector circuit.

FIG. 3 illustrates an example diagram 300 of a portion of the pulse selector circuit 200. Therefore, reference is to be made to the example of FIG. 2 in the following description of the example of FIG. 3. In the example of FIG. 3, the diagram 300 includes the second input Josephson junction $J_{IN2}$, the first inductor $L_1$, the current direction inductor $L_{DIR}$, the second inductor $L_2$, the escape Josephson junction $J_{ESC}$, and the first output Josephson junction $J_{OUT1}$.

In response to the RQL pulse $RQL_{IN}$ propagating through the input JTL 202, the first and second input Josephson junctions $J_{IN1}$ and $J_{IN2}$ trigger during the positive amplitude of the in-phase component of the clock signal $CLK_I$. In the example of FIG. 3, the triggering of the second input Josephson junction $J_{IN2}$ from the fluxon of the RQL pulse $RQL_{IN}$ provides a first circulating current $I_{CIR1}$, demonstrated in a clockwise manner from the second input Josephson junction $J_{IN2}$ and through the current direction inductor $L_{DIR}$ to the low-voltage rail. The fluxon propagates through first and second inductors $L_1$ and $L_2$, and in response to the bias current $I_Q$ provided during the positive portion of the quadrature-phase component of the clock signal $CLK_Q$, the fluxon triggers the first output Josephson junction $J_{OUT1}$. The triggering of the first output Josephson junction $J_{OUT1}$ provides a second circulating current $I_{CIR2}$, demonstrated in a counter-clockwise manner from the first output Josephson junction $J_{OUT1}$ through the escape Josephson junction $J_{ESC}$, through the second inductor $L_2$, and through the current direction inductor $L_{DIR}$ to the low-voltage rail. Therefore, the second circulating current $I_{CIR2}$ has a direction that is opposite the first circulating current $I_{CIR1}$, and is opposite in polarity relative to the propagation of the RQL pulse $RQL_{IN}$, demonstrated at 302. As an example, the escape Josephson junction $J_{ESC}$ can be tuned to have a critical current that is greater than the first output Josephson junction $J_{OUT2}$. Accordingly, the escape Josephson junction $J_{ESC}$ does not trigger in response to the second circulating current $I_{CIR2}$.

In the example of FIG. 2, the fluxon of the RQL pulse $RQL_{IN}$ passes the escape Josephson junction $J_{ESC}$ and triggers the first output Josephson junction $J_{OUT2}$ to generate the second circulating current $I_{CIR2}$. Therefore, the fluxon continues to propagate through the output JTL 206 to the output 208 as the unipolar pulse $SFQ_{OUT}$ (e.g., via the triggering of the second output Josephson junction $J_{OUT2}$). However, the antifluxon follows the fluxon through the pulse selector circuit 200. The antifluxon can reset the second input Josephson junction $J_{IN2}$, thus canceling the first circulating current $I_{CIR1}$. The antifluxon can thus propagate through the first and second inductors $L_1$ and $L_2$. However, the second circulating current $I_{CIR2}$ acts as a bias current for the escape Josephson junction $J_{ESC}$ with respect to the antifluxon based on the second circulating current $I_{CIR2}$ having a current direction that is opposite the propagation direction of the RQL pulse $RQL_{IN}$. Therefore, the antifluxon triggers the escape Josephson junction $J_{ESC}$, which cancels the propagation of the antifluxon to the output JTL 206. As a result, the antifluxon is not propagated through the output JTL 206, thus providing just the fluxon from the output as the unipolar pulse $SFQ_{OUT}$. Because the antifluxon does not propagate to the output JTL 206, the output Josephson junctions $J_{OUT1}$ and $J_{OUT2}$ are not reset, and thus remain triggered (e.g., in a $2\pi$ state). The triggering of the escape Josephson junction $J_{ESC}$ can cancel the second circulating current $I_{CIR2}$. Therefore, an additional fluxon and antifluxon pair associated with a subsequent RQL pulse $RQL_{IN}$ received at the input 204 can repeat the process described above. Accordingly, a fluxon of the subsequent RQL pulse $RQL_{IN}$ triggers the output Josephson junction $J_{OUT2}$ to generate the second circulating current $I_{CIR2}$, thereby blocking the antifluxon associated with subsequent respective RQL pulse $RQL_{IN}$, as described above.

As described previously, the blocking of the fluxon or the antifluxon is based on the direction of the bias current through the escape Josephson junction $J_{ESC}$. Therefore, if the second circulating current $I_{CIR2}$ has a current direction that is opposite what is demonstrated in the example of FIG. 3 (e.g., clockwise), the escape Josephson junction $J_{ESC}$ is biased by a bias current that is in the same direction as the propagation of the RQL pulse $RQL_{IN}$ through the pulse selector circuit 200. For example, instead of the current direction inductor $L_{DIR}$ being coupled to the low-voltage rail, the current direction inductor $L_{DIR}$ can be coupled to a superconducting phase source (e.g., a Josephson junction in a $2\pi$ state). As a result, the circulating current $I_{CIR2}$ can be provided from the superconducting phase source through the current direction inductor $L_{DIR}$, through the second inductor $L_2$, through the escape Josephson junction $J_{ESC}$, and through the first output Josephson junction $J_{OUT1}$. Therefore, the bias of the escape Josephson junction $J_{ESC}$ results in a triggering of the escape Josephson junction $J_{ESC}$ in response to the positive fluxon, thus blocking the positive fluxon from propagating to the output JTL 206. The triggering of the escape Josephson junction $J_{ESC}$ results in cancellation of the second circulating current $I_{CIR2}$, thereby allowing the antifluxon to pass through the output JTL 206 at the negative polarity of the quadrature phase component of the clock signal $CLK_Q$. Accordingly, the antifluxon is provided as the unipolar pulse $SFQ_{OUT}$ from the output 208.

The pulse selector circuit 200 is therefore described herein as providing a manner for selecting one pulse of a pulse pair provided by the RQL pulse $RQL_{IN}$ to be propagated from the output 208. Accordingly, superconducting logic-gates and other superconducting circuits that implement single pulse (e.g., SFQ pulse) data can be implemented in RQL circuits. The selection of the single pulse is described herein as being selective, such as in a predetermined manner or in a selective manner, as described in greater detail herein. Furthermore, the selection of the single pulse can be implemented using a clock signal, such as the RQL clock signal, for ease in implementation in an RQL circuit system.

Figure 4:
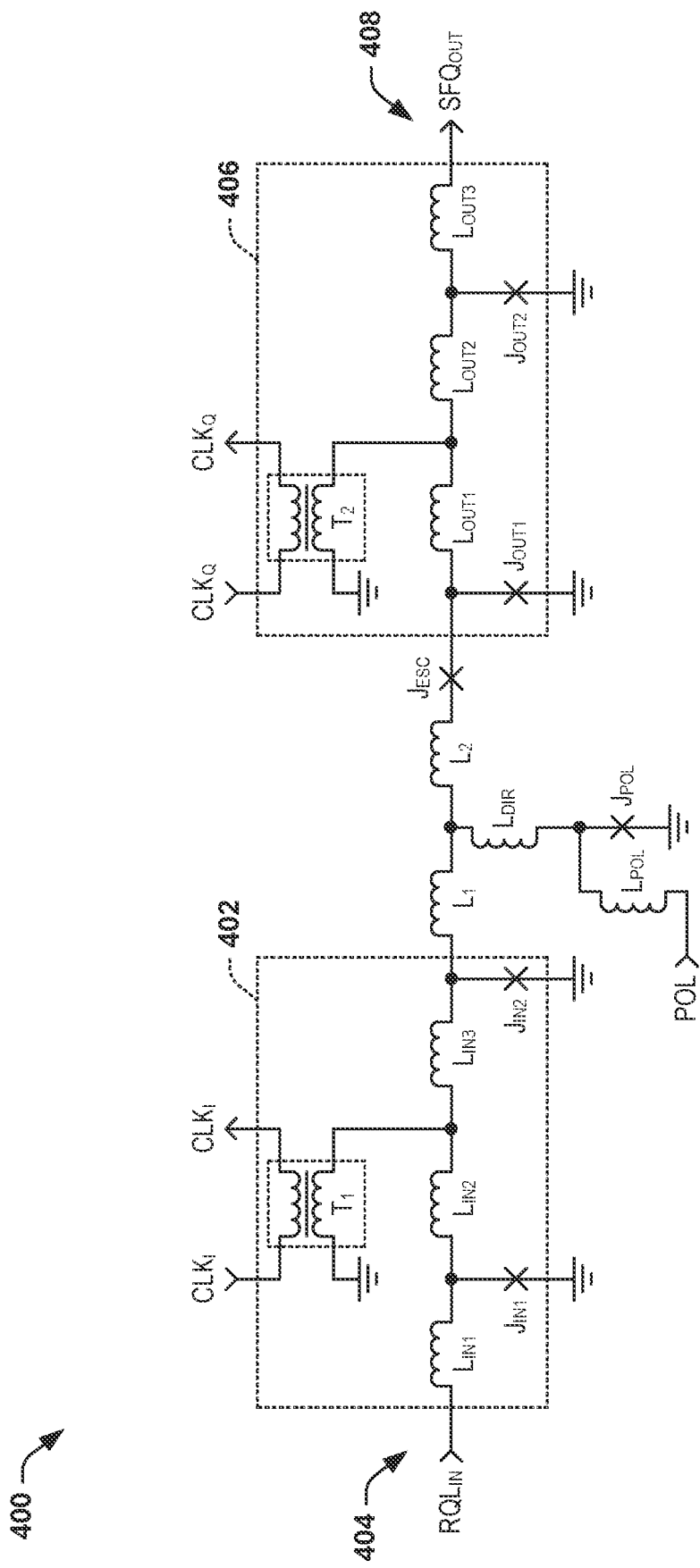
FIG. 4 illustrates another example of a pulse selector circuit.

FIG. 4 illustrates another example of a pulse selector circuit 400. The pulse selector circuit 400 can be configured substantially the same as the pulse selector system 100 in the example of FIG. 1. Therefore, reference is to be made to the example of FIG. 1 in the following description of the example of FIG. 4.

The pulse selector circuit 400 includes an input JTL 402. The input JTL 402 includes a first input inductor $L_{IN1}$, a first input Josephson junction $J_{IN1}$, a second input Josephson junction $J_{IN2}$, a second input inductor $L_{IN2}$, and a third input inductor $L_{IN3}$. The second and third input inductors $L_{IN2}$ and $L_{IN3}$ interconnect the first and second Josephson junctions $J_{IN1}$ and $J_{IN2}$. A transformer $T_1$ inductively couples an in-phase component of an RQL clock signal, demonstrated in the example of FIG. 4 as a signal $CLK_I$, to provide a bias current $I_I$ between the second and third input inductors $L_{IN2}$ and $L_{IN3}$. Therefore, during a positive amplitude of the in-phase component of the clock signal $CLK_I$, the input JTL 402 propagates an RQL pulse $RQL_{IN}$ that is received at an input 404.

The pulse selector circuit 400 also includes an output JTL 406. The output JTL 406 includes a first output Josephson junction $J_{OUT1}$, a second output Josephson junction $J_{OUT2}$, a first output inductor $L_{OUT1}$, a second output inductor $L_{OUT2}$, and a third output inductor $L_{OUT3}$. The first and second output inductors $L_{OUT1}$ and $L_{OUT2}$ interconnect the first and second Josephson junctions $J_{OUT1}$ and $J_{OUT2}$. A transformer $T_2$ inductively couples a quadrature-phase component of an RQL clock signal, demonstrated in the example of FIG. 4 as a signal $CLK_Q$, to provide a bias current $I_Q$ between the first and second output inductors $L_{OUT1}$ and $L_{OUT2}$. Therefore, during a positive amplitude of the quadrature-phase component of the clock signal $CLK_I$, and thus approximately 90° out of phase of the in-phase component of the clock signal $CLK_I$, the output JTL 406 propagates a unipolar pulse $SFQ_{OUT}$ that is provided from an output 408.

The pulse selector circuit 400 includes a first inductor $L_1$ and a second inductor $L_2$ that are arranged between the input and output JTLs 402 and 406. The pulse selector circuit 400 further includes a current direction inductor $L_{DIR}$ that is arranged between the first and second inductors $L_1$ and $L_2$ and is coupled to a polarity-switch Josephson junction $J_{POL}$ that is coupled to the low-voltage rail (e.g., ground). A current direction signal POL is provided to the node between the current direction inductor $L_{DIR}$ via a polarity-switch inductor $L_{POL}$. Additionally, an escape Josephson junction $J_{ESC}$ is arranged in series with the second inductor $L_2$ between the current direction inductor $L_{DIR}$ and the output JTL 406.

In the example of FIG. 4, while the polarity-switch Josephson junction $J_{POL}$ is in a deactivated state (e.g., in a zero state), the pulse selector circuit 400 operates the same as described in the examples of FIGS. 2 and 3. For example, the zero state of the polarity-switch Josephson junction $J_{POL}$ provides coupling of the current direction inductor $L_{DIR}$ to the low-voltage rail to provide the second circulating current $I_{CIR2}$ to provide bias current through the escape Josephson junction $J_{ESC}$ in a direction that is opposite the propagation direction of the RQL pulse $RQL_{IN}$, as described above in the example of FIGS. 2 and 3. Therefore, the escape Josephson junction $J_{ESC}$ selects the fluxon to pass through the escape Josephson junction $J_{ESC}$ and rejects the antifluxon, and the output JTL 406 propagates the fluxon to the output 408 as the unipolar pulse $SFQ_{OUT}$, as described above in the examples of FIGS. 2 and 3.

As another example, the current direction signal POL can be provided to the polarity-switch Josephson junction $J_{POL}$ to trigger the polarity-switch Josephson junction $J_{POL}$. For example, the current direction signal POL can be provided as a pulse signal (e.g., an SFQ pulse) to trigger the polarity-switch Josephson junction $J_{POL}$ (e.g., based on the bias provided by the first circulating current $I_{CIR1}$). The triggering of the polarity-switch Josephson junction $J_{POL}$ can set the polarity-switch Josephson junction $J_{POL}$ to a $2\pi$ state, and thus as a superconducting phase source. Accordingly, the triggered polarity-switch Josephson junction $J_{POL}$ can provide the second circulating current $I_{CIR2}$ to provide bias current through the escape Josephson junction $J_{ESC}$ in a direction that is with the propagation direction of the RQL pulse $RQL_{IN}$. Therefore, the escape Josephson junction $J_{ESC}$ rejects the fluxon and selects the antifluxon to pass through the escape Josephson junction $J_{ESC}$, and the output JTL 406 propagates the antifluxon to the output 408 as the unipolar pulse $SFQ_{OUT}$.

As another example, the polarity-switch Josephson junction $J_{POL}$ can be toggled between the zero state and the $2\pi$ state. For example, subsequent to being triggered to set the polarity-switch Josephson junction $J_{POL}$ to the $2\pi$ state, the current direction signal POL can be provided in a different state to reset the polarity-switch Josephson junction $J_{POL}$ to the zero state. In the example of the current direction signal POL being provided as a pulse signal (e.g., an SFQ pulse) to trigger the polarity-switch Josephson junction $J_{POL}$, the current direction signal POL can subsequently be provided as a negative pulse signal (e.g., an antifluxon) to reset the polarity-switch Josephson junction $J_{POL}$. Therefore, the reset of the polarity-switch Josephson junction $J_{POL}$ can set the polarity-switch Josephson junction $J_{POL}$ from the $2\pi$ state to the zero state to change the direction of the second circulating current $I_{CIR2}$ as biasing the escape Josephson junction $J_{ESC}$ from the same direction as the propagation of the RQL pulse $RQL_{IN}$ to the opposite direction as the propagation of the RQL pulse $RQL_{IN}$. Accordingly, the pulse selector circuit 400 can be programmable for selection of a desired one of the fluxon and the antifluxon of the RQL pulse $RQL_{IN}$ for output as the unipolar pulse $SFQ_{OUT}$ from the output 408.

Figure 5:
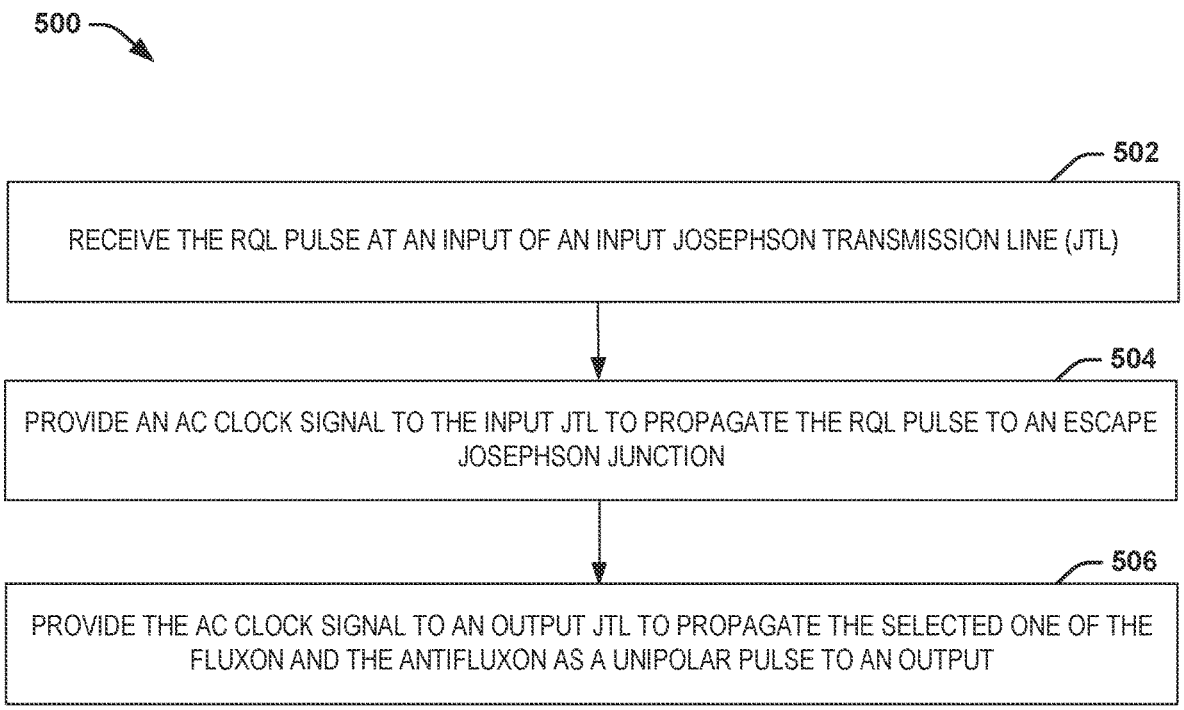
FIG. 5 illustrates an example of a method for selecting a pulse from an RQL pulse.

In view of the foregoing structural and functional features described above, a methodology in accordance with various aspects of the disclosure will be better appreciated with reference to FIG. 5. FIG. 5 illustrates an example of a method 500 for selecting a pulse (e.g., fluxon or antifluxon) from an RQL pulse (e.g., the RQL pulse $RQL_{IN}$). It is to be understood and appreciated that the method for FIG. 5 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

At 502, the RQL pulse is received at an input (e.g., the input 204) of an input JTL (e.g., input JTL 102). The RQL pulse includes a fluxon and an antifluxon. At 504, an AC clock signal (e.g., the in-phase component $CLK_I$) is provided to the input JTL to propagate the RQL pulse to an escape Josephson junction (e.g., the escape Josephson junction 106). The escape Josephson junction can be configured to pass one of the fluxon and the antifluxon of the RQL pulse and to trigger in response to the other of the fluxon and the antifluxon of the RQL pulse to block the other of the fluxon and the antifluxon of the RQL pulse. At 506, the AC clock signal (e.g., the quadrature-phase component $CLK_Q$) is provided to an output JTL (e.g., the output JTL 104) to propagate the selected one of the fluxon and the antifluxon as a unipolar pulse to an output.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A pulse selector system comprising:
   an input Josephson transmission line (JTL) configured to propagate input reciprocal quantum logic (RQL) pulses received at an input based on a bias signal, each of the RQL pulses comprising a fluxon and an antifluxon;
   an escape Josephson junction coupled to an output of the input JTL, the escape Josephson junction being configured to pass a selected one of the fluxon and the antifluxon of a given one of the RQL pulses and to trigger in response to the non-selected other of the fluxon and the antifluxon of the given one of the RQL pulses to block the non-selected other of the fluxon and the antifluxon of the given one of the RQL pulses; and
   an output JTL configured to propagate the selected one of the fluxon and the antifluxon of the given one of the RQL pulses as a unipolar pulse to an output based on the bias signal.

2. The system of claim 1, further comprising a current control inductor coupled to the escape Josephson junction and the output of the input JTL, the current control inductor being configured to one of conduct bias current from the escape Josephson junction, such that the escape Josephson junction passes the fluxon and triggers to block the antifluxon, or conduct the bias current to the escape Josephson junction, such that the escape Josephson junction passes the antifluxon and triggers to block the fluxon.

3. The system of claim 2, wherein the current control inductor is arranged between a node and a low-voltage rail, wherein the node is arranged between a first inductor and a second inductor, wherein the escape Josephson junction is arranged in series with the second inductor and the output JTL.

4. The system of claim 2, further comprising a superconducting phase source coupled to the current control inductor, the superconducting phase source being activated to conduct the bias current to the escape Josephson junction.

5. The system of claim 4, wherein the superconducting phase source is configured as a Josephson junction that is activated to conduct the bias current to the escape Josephson junction and is deactivated to conduct the bias current from the escape Josephson junction.

6. The system of claim 4, wherein the superconducting phase source is controlled by a current direction signal.

7. The system of claim 4, wherein the current control inductor is arranged between the input JTL and the output JTL and is configured to provide a circulating current through the escape Josephson junction based on a direction of the bias current.

8. The system of claim 7, wherein the circulating current flows from an output Josephson junction associated with the output JTL to a low-voltage rail through the escape Josephson junction and through the current control inductor based on the fluxon passing the escape Josephson junction and triggering the output Josephson junction to block the antifluxon, wherein the circulating current flows from the superconducting phase source through the current control inductor and through the escape Josephson junction to block the fluxon and pass the antifluxon.

9. The system of claim 1, wherein the bias signal is arranged as an AC clock signal.

10. The system of claim 9, wherein the AC clock signal is arranged as an RQL clock signal comprising:
  an in-phase component that is provided to the input JTL to propagate the RQL pulse from the input; and
  a quadrature-phase component that is provided to the output JTL to propagate the unipolar pulse to the output.

11. A method for selecting a pulse from each of a plurality of reciprocal quantum logic (RQL) pulse, the method comprising:
  receiving the RQL pulses at an input of an input Josephson transmission line (JTL), each of the RQL pulses comprising a fluxon and an antifluxon;
  providing an AC clock signal to the input JTL to propagate the RQL pulses to an escape Josephson junction, the escape Josephson junction being configured to pass a selected one of the fluxon and the antifluxon of a given one of the RQL pulses and to trigger in response to the non-selected other of the fluxon and the antifluxon of the given one of the RQL pulses to block the non-selected other of the fluxon and the antifluxon of the given one of the RQL pulses; and
  providing the AC clock signal to an output JTL to propagate the selected one of the fluxon and the antifluxon of the given one of the RQL pulses as a unipolar pulse to an output.

12. The method of claim 11, further comprising one of conducting a bias current from the escape Josephson junction such that the escape Josephson junction passes the fluxon and triggers to block the antifluxon and conducting the bias current to the escape Josephson junction such that the escape Josephson junction passes the antifluxon and triggers to block the fluxon.

13. The method of claim 12, further comprising providing a current direction signal to control the bias current as being conducted from or to the escape Josephson junction.

14. The method of claim 12, wherein conducting the bias current to the escape Josephson junction comprises activating a superconducting phase source to conduct the bias current through a current control inductor that is coupled to the escape Josephson junction.

15. The method of claim 11, wherein providing the AC clock signal comprises:
  providing an in-phase component of an RQL clock signal to the input JTL to propagate the RQL pulse through the input JTL; and
  providing a quadrature-phase component of the RQL clock signal to the output JTL to propagate the unipolar pulse through the output JTL.

16. A pulse selector system comprising:
  an input Josephson transmission line (JTL) configured to propagate an input reciprocal quantum logic (RQL) pulse received at an input based on a bias signal, the RQL pulse comprising a fluxon and an antifluxon;
  an escape Josephson junction coupled to an output of the input JTL;
  a current control inductor coupled to the escape Josephson junction and an output of the input JTL, the current control inductor being configured to conduct bias current from the escape Josephson junction to select the fluxon and to trigger the escape Josephson junction to block the antifluxon, or to conduct the bias current to the escape Josephson junction to trigger the escape Josephson junction to block the fluxon and to select the antifluxon; and
  an output JTL configured to propagate the selected one of the fluxon and the antifluxon as a unipolar pulse to an output based on the bias signal.

17. The system of claim 16, further comprising a superconducting phase source coupled to the current control inductor, the superconducting phase source being activated to conduct the bias current to the escape Josephson junction.

18. The system of claim 17, wherein the superconducting phase source is controlled by a current direction signal.

19. The system of claim 16, wherein the bias signal is arranged as an AC clock signal.

20. The system of claim 19, wherein the AC clock signal is arranged as an RQL clock signal comprising:
  an in-phase component that is provided to the input JTL to propagate the RQL pulse from the input; and
  a quadrature-phase component that is provided to the output JTL to propagate the unipolar pulse to the output.

* * * * *